US012805172B2

(12) United States Patent
Wu et al.

(10) Patent No.: US 12,805,172 B2
(45) Date of Patent: Nov. 17, 2026

(54) DISPLAY DEVICE

(71) Applicant: InnoLux Corporation, Miao-Li County (TW)

(72) Inventors: Yuan-Lin Wu, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 369 days.

(21) Appl. No.: 18/426,306

(22) Filed: Jan. 29, 2024

(65) Prior Publication Data

US 2024/0306479 A1 Sep. 12, 2024

(30) Foreign Application Priority Data

Mar. 10, 2023 (CN) ......................... 202310229608.0

(51) Int. Cl.
*H10K 59/80* (2023.01)

(52) U.S. Cl.
CPC ................................ *H10K 59/8792* (2023.02)

(58) Field of Classification Search
CPC .. H10K 59/8792; H10K 59/80; H10K 50/858; H10K 59/38; H10K 59/879
See application file for complete search history.

(56) References Cited

U.S. PATENT DOCUMENTS

| | | | | |
|---|---|---|---|---|
| 12,058,911 B2 | 8/2024 | Park | | |
| 12,540,276 B2 * | 2/2026 | Kim | .................. | C09K 11/0883 |
| 2019/0165325 A1 | 5/2019 | Lee | | |
| 2022/0173362 A1 | 6/2022 | Kim | | |
| 2022/0342508 A1 | 10/2022 | Kwon | | |
| 2023/0105598 A1 * | 4/2023 | Kim | .................. | C09K 11/0883 257/40 |

FOREIGN PATENT DOCUMENTS

CN 112805600 5/2021

* cited by examiner

*Primary Examiner* — Nikolay K Yushin
(74) *Attorney, Agent, or Firm* — Winston Hsu

(57) ABSTRACT

A display device including a substrate, a display layer and an optical structure is disclosed. The display layer is disposed on the substrate and includes light emitting elements. The optical structure is disposed on the display layer and includes a first light blocking layer, a first optical filter, a second optical filter, and a second light blocking layer. The first light blocking layer has first openings overlapped with the light emitting elements. The first optical filter and the second optical filter are disposed in at least one of the first openings respectively. The second light blocking layer is disposed on the first light blocking layer and has second openings overlapped with the first openings. The first optical filter is separated from the second optical filter, and at least a portion of the second light blocking layer is disposed between the first optical filter and the second optical filter.

19 Claims, 12 Drawing Sheets

DISPLAY DEVICE

BACKGROUND OF THE DISCLOSURE

1. Field of the Disclosure

The present disclosure relates to a display device, and more particularly to a display device including a light blocking layer and an optical filter.

2. Description of the Prior Art

In recent years, display devices have become more and more important in various electronic applications, such as vehicle displays, wearable devices (e.g., smart watches), smart phones, tablets, notebook computers and e-book readers. An anti-reflection layer can be applied to a display device to determine the optical characteristics of the light outputted by the display device. However, the external-attached anti-reflection layer is easy to be peeled off or poorly adhered, causing yield problems.

SUMMARY OF THE DISCLOSURE

One of objectives of the present disclosure is to provide a display device, wherein an optical structure is disposed on a display layer, and the optical structure includes optical filters and two layers of light blocking layers, so that an excellent anti-reflection effect may be achieved, and the above structure may be matched with various product types of deformable display devices. The design of the optical structure may be used to block light with large angles so as to reduce the probability of the light from one of the optical filters entering another optical filter, thereby improving the problem of light leakage.

An embodiment of the present disclosure provides a display device. The display device includes a substrate, a display layer and an optical structure. The display layer is disposed on the substrate, and the display layer includes a plurality of light emitting elements. The optical structure is disposed on the display layer, and the optical structure includes a first light blocking layer, a first optical filter, a second optical filter and a second light blocking layer. The first light blocking layer has a plurality of first openings overlapped with the light emitting elements respectively. The first optical filter is disposed in at least one of the first openings, and the second optical filter is disposed in at least another one of the first openings and adjacent to the first optical filter. The second light blocking layer is disposed on the first light blocking layer and has a plurality of second openings overlapped with the first openings respectively. In a cross-sectional view of the display device, the first optical filter is separated from the second optical filter, and at least a portion of the second light blocking layer is disposed between the first optical filter and the second optical filter.

An embodiment of the present disclosure provides a display device. The display device includes a substrate, a display layer and an optical structure. The substrate has a first region with a first Gaussian curvature and a second region with a second Gaussian curvature, and an absolute value of the first Gaussian curvature is less than an absolute value of the second Gaussian curvature. The display layer is disposed on the substrate, and the display layer includes a plurality of first light emitting elements on the first region and a plurality of second light emitting elements on the second region. The optical structure is disposed on the display layer, and the optical structure includes a plurality of first optical filter regions overlapped with the plurality of first light emitting elements respectively and a plurality of second optical filter regions overlapped with the plurality of second light emitting elements respectively. One of the first optical filter regions has a first area, one of the second optical filter regions has a second area, and the second area is greater than the first area.

These and other objectives of the present disclosure will no doubt become obvious to those of ordinary skill in the art after reading the following detailed description of the embodiment that is illustrated in the various figures and drawings.

DETAILED DESCRIPTION

Figure 1:
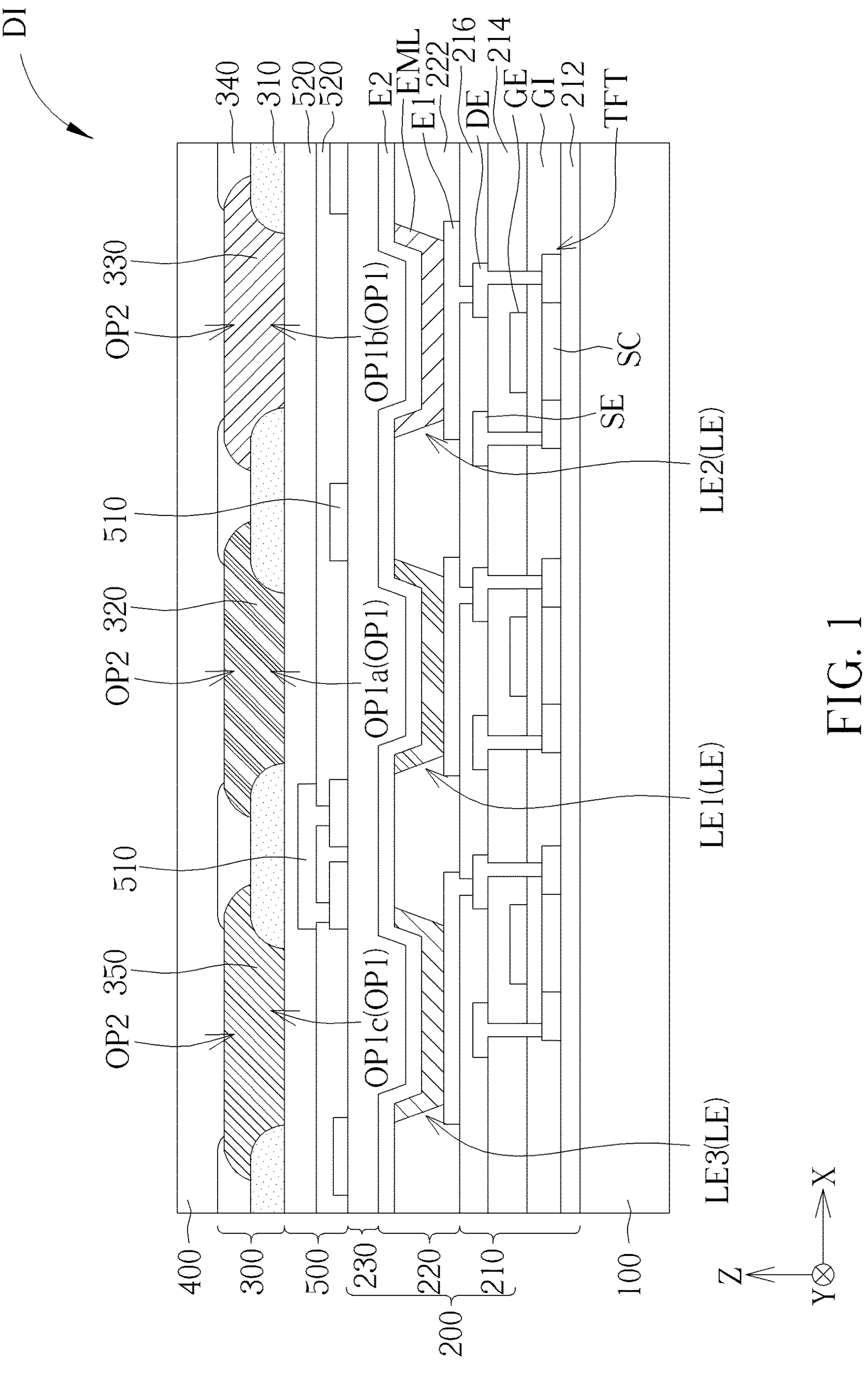
FIG. 1 is a cross-sectional schematic diagram of a display device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The directional terms mentioned in this document, such as "up", "down", "front", "back", "left", "right", etc., are only directions referring to the drawings. Therefore, the directional terms used are for illustration, not for limitation of the present disclosure.

The terms "about", "equal", "identical" or "the same", and "substantially" or "approximately" mentioned in this document generally mean being within 20% of a given value or range, or being within 10%, 5%, 3%, 2%, 1% or 0.5% of a given value or range.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms. Accordingly, in the following description, a first constituent element may be a second constituent element in a claim.

The display device of the present disclosure may be applied in an electronic device, wherein the display device may include a non-self-emissive display device or a self-emissive display device. In addition, the electronic device may further include a backlight device, an antenna device, a sensing device or a tiled device, but not limited herein. The electronic device may include a bendable or flexible electronic device. The antenna device may include a liquid-crystal type antenna device or an antenna device other than liquid-crystal type, and the sensing device may include a sensing device used for sensing capacitance, light, heat or ultrasonic waves, but not limited herein. The electronic device may include electronic elements such as passive elements and active elements, for example, capacitors, resistors, inductors, diodes, transistors, etc. The diode may include a light-emitting diode or a photodiode. For example, the light-emitting diode may include an organic light-emitting diode (OLED), a mini light-emitting diode (mini LED), a micro light-emitting diode (micro LED) or a quantum dot light-emitting diode (quantum dot LED), but not limited herein. The tiled device may be, for example, a display tiled device or an antenna tiled device, but not limited herein. It should be noted that the electronic device may be any arrangement and combination of the above, but not limited herein.

It should be noted that the technical features in different embodiments described in the following can be replaced, recombined, or mixed with one another to constitute another embodiment without departing from the spirit of the present disclosure.

Please refer to FIG. 1, which is a cross-sectional schematic diagram of a display device according to a first embodiment of the present disclosure. As shown in FIG. 1, the display device DI includes a substrate 100, a display layer 200 and an optical structure 300. The substrate 100 may be a rigid substrate or a flexible substrate. The rigid substrate may include, for example, glass, ceramics or sapphire, and the flexible substrate may include, for example, polyimide (PI), polycarbonate (PC), polyethylene terephthalate (PET), poly(methyl methacrylate) (PMMA) or a composite layer composed of organic material and inorganic material, but not limited herein. The display layer 200 is disposed on the substrate 100, and the display layer 200 includes a plurality of light emitting elements LE. The light emitting element LE may be, for example, an organic light emitting diode (OLED), an inorganic light emitting diode (LED) or a quantum dot LED (QLED), but not limited herein. Specifically, the display layer 200 may include a circuit layer 210, a light emitting layer 220 and an intermediate layer 230. The light emitting layer 220 is disposed on the circuit layer 210, wherein the circuit layer 210 includes a plurality of thin film transistors TFT, and the light emitting layer 220 includes a plurality of light emitting elements LE. The thin film transistors TFT are used, for example, as switching elements or driving elements. The thin film transistor TFT may include a drain DE, a source SE, a gate GE and a semiconductor layer SC, and an insulating layer GI is provided between the gate GE and the semiconductor layer SC, which may be used as a gate dielectric layer in the thin film transistor TFT. The intermediate layer 230 includes an organic layer, an inorganic layer or a composite layer composed of an inorganic layer, an organic layer and an inorganic layer, but not limited herein.

The detailed structures of the circuit layer 210 and the light emitting layer 220 in the display layer 200 are further described below, taking the embodiment shown in FIG. 1 as an example, but the present disclosure is not limited herein. The circuit layer 210 may include an insulating layer 212 (e.g., a buffer layer, the material of which may include silicon oxide (SiOx) and/or silicon nitride (SiNx)) disposed on the substrate 100, while the semiconductor layer SC is disposed on the insulating layer 212, the insulating layer GI is disposed on the semiconductor layer SC, and the gate GE is disposed on the insulating layer GI. An insulating layer 214 is disposed on the gate GE, the source SE and the drain DE are disposed on the insulating layer 214 and electrically connected to the semiconductor layer SC respectively, and an insulating layer 216 is disposed on the source SE and the drain DE. In some embodiments, the circuit layer 210 may further include other active elements, passive elements and/or wires (not shown). The light emitting layer 220 may include an insulating layer 222 (e.g., a pixel definition layer) disposed on the insulating layer 216, and the insulating layer 222 may have a plurality of openings for disposing the light emitting elements LE respectively. As shown in FIG. 1, each of the light emitting elements LE may include, for example, a first electrode E1, an emissive material layer EML and a second electrode E2. The first electrode E1 is disposed on the insulating layer 216 and electrically connected to the drain DE, and the emissive material layer EML is disposed between the first electrode E1 and the second electrode E2, wherein the second electrode E2 may serve as a common electrode and extend and correspond to the plurality of light emitting elements LE, but not limited herein.

The optical structure 300 is disposed on the display layer 200, and the optical structure 300 includes a first light blocking layer 310, a first optical filter 320, a second optical filter 330 and a second light blocking layer 340. The first light blocking layer 310 has a plurality of first openings OP1 overlapped with the light emitting elements LE respectively, that is, each of the first openings OP1 is correspondingly overlapped with one of the light emitting elements LE. The description "A overlaps B" or "A is overlapped with B"

referred in the present disclosure may mean that A is overlapped with B in a normal direction Z of the substrate 100, wherein the normal direction Z may be opposite to a top-view direction of the display device DI. The first optical filter 320 is disposed in at least one of the first openings OP1, the second optical filter 330 is disposed in at least another one of the first openings OP1, and the second optical filter 330 is adjacent to the first optical filter 320. That is to say, the first optical filter 320 may be disposed in one or more first openings OP1, such as disposed in the first opening OP1*a*, while the second optical filter 330 may be adjacently disposed in another one or more first openings OP1, such as disposed in the first opening OP1*b* adjacent to the first opening OP1*a*. Although only one first opening OP1*a* and one first opening OP1*b* are shown in FIG. 1, the first light blocking layer 310 may have a plurality of first openings OP1*a* and/or a plurality of first openings OP1*b* in practice. The first optical filter 320 and the second optical filter 330 may be filter layers or filters capable of filtering visible light respectively, such as blue color resist, green color resist, red color resist, a bandpass filter composed of high refractive index material and low refractive index material stacked with each other, a reflection control layer or other suitable optical filters. The materials of the first optical filter 320 and the second optical filter 330 may include, for example, organic materials and/or inorganic materials (e.g., elements such as aluminum and chlorine), but not limited herein. According to the embodiment shown in FIG. 1, the light emitting element LE1 corresponding to the first optical filter 320 and the light emitting element LE2 corresponding to the second optical filter 330 may emit different colors of light respectively. For example, the light emitting element LE1 may emit green light or red light, and the corresponding first optical filter 320 may include green color resist or red color resist, while the light emitting element LE2 may emit blue light, and the corresponding second optical filter 330 may include blue color resist or a diffusion layer, but not limited herein. The second light blocking layer 340 is disposed on the first light blocking layer 310 and has a plurality of second openings OP2, and each of the second openings OP2 is overlapped with one first opening OP1 respectively, that is, each of the second openings OP2 is overlapped with one of the first openings OP1. The first light blocking layer 310 and the second light blocking layer 340 may block visible light individually, and the optical densities (OD) of the first light blocking layer 310 and the second light blocking layer 340 may be greater than or equal to 1, preferably greater than or equal to 3. The materials of the first light blocking layer 310 and the second light blocking layer 340 may respectively include black resin, black photoresist, gray photoresist, white photoresist, metal with low reflectivity, metal treated by oxidation, other resin materials or other suitable materials, wherein the main material of the resin material may be, for example, organic polymer material, acrylate material, photosensitive acrylate material or pigment dispersion resin, but not limited herein. The first light blocking layer 310 and the second light blocking layer 340 may be made of the same or different materials.

In a cross-sectional view of the display device DI, the first optical filter 320 is separated from the second optical filter 330, and at least a portion of the second light blocking layer 340 is disposed between the first optical filter 320 and the second optical filter 330. As shown in FIG. 1, a portion of the second light blocking layer 340 may be disposed between the first optical filter 320 and the second optical filter 330 in a direction X, wherein the direction X may be, for example, perpendicular to the direction Z and parallel to an upper surface of the substrate 100. The first light blocking layer 310 may be in contact with the second light blocking layer 340, that is, at the position where the first light blocking layer 310 contacts the second light blocking layer 340, there is no other layer existing between the first light blocking layer 310 and the second light blocking layer 340. A portion of the second light blocking layer 340, which is the upper layer, is located between the first optical filter 320 and the second optical filter 330 which are adjacent to each other, which may be used to block the light with large angles, so as to reduce the probability of the light from one of the optical filters entering another optical filter, thereby improving the problem of light leakage. Furthermore, the first light blocking layer 310 and the second light blocking layer 340 in contact with each other may separate the first optical filter 320 and the second optical filter 330 which are adjacent to each other, so that the first optical filter 320 and the second optical filter 330 are not in contact with each other, thereby effectively blocking light and improving the problem of light leakage. In the cross-sectional view of the display device DI shown in FIG. 1, a portion of the first optical filter 320 may be disposed between the first light blocking layer 310 and the second light blocking layer 340 in the direction Z. For example, in a cross-sectional view, an edge of the first optical filter 320 may cover and contact the first light blocking layer 310, and the second light blocking layer 340 may cover and contact the edge of the first optical filter 320 and a portion of an upper surface of the first light blocking layer 310, so that a portion of the first optical filter 320 may be overlapped with the first light blocking layer 310 and the second light blocking layer 340. Although FIG. 1 shows a cross-sectional view in the direction X, a cross-sectional structure in a direction Y (not shown) may have a similar stacking structure of films, wherein the direction Y is, for example, perpendicular to the direction Z and the direction X respectively, and the direction Y is parallel to the upper surface of the substrate 100. Also as the above design, a portion of the second optical filter 330 may be disposed between the first light blocking layer 310 and the second light blocking layer 340. Through the structure stacked layer-by-layer described above, light may be effectively blocked between different regions. In some embodiments, the cross-sectional structures of the edge of the first optical filter, an edge of the second optical filter 330 and edges of the first light blocking layer 310 and the second light blocking layer 340 (e.g., the portions of the above layers which are stacked and overlapped with each other) may have shapes with curved surfaces, so that the edges of the elements may be stacked more effectively, and gaps or peeling between layers do not occur easily.

According to the embodiment shown in FIG. 1, the optical structure 300 may further include a third optical filter 350. The third optical filter 350 may be disposed in at least one of the first openings OP1, and the third optical filter 350 may be adjacent to the first optical filter 320 and/or the second optical filter 330. For example, the third optical filter 350 may be disposed in the first opening OP1*c*, wherein the first opening OP1*c* is adjacent to the first opening OP1*a* and located on the opposite side to the first opening OP1*b*, but not limited herein. The third optical filter 350 may include a filter layer capable of filtering visible light, and the structure and material of the third optical filter 350 may be referred to the first optical filter 320 and the second optical filter 330 described above, which will not be repeated herein. The light emitting element LE3 corresponding to the third optical filter 350, the light emitting element LE1 corresponding to the first optical filter 320 and the light emitting element LE2 corresponding to the second optical filter 330 may emit different colors of light respectively. For example, the light emitting element LE3 may emit red light, and the corresponding third optical filter 350 may include red color resist, while the light emitting element LE1 and the light emitting element LE2 may emit green light and blue light respectively, and the corresponding first optical filter 320 and second optical filter 330 may include green color resist and blue color resist, but not limited herein. In the cross-sectional view of the display device DI shown in FIG. 1, the third optical filter 350 is separated from the first optical filter 320, at least a portion of the second light blocking layer 340 may be disposed between the third optical filter 350 and the first optical filter 320 in the direction X, and a portion of the third optical filter 350 may be disposed between the first light blocking layer 310 and the second light blocking layer 340 in the direction Z.

As shown in FIG. 1, the display device DI may further include an organic layer 400 disposed on the second light blocking layer 340 and the first optical filter 320, that is, the organic layer 400 may cover the second light blocking layer 340, the first optical filter 320, the second optical filter 330 and the third optical filter 350. The organic layer 400 includes organic material, which may be used as a planar layer to fill and planarize the irregular terrain therebelow. In some embodiments, as shown in FIG. 1, the display device DI may further include a touch layer 500 disposed on the display layer 200. For example, the touch layer 500 may be disposed between the display layer 200 and the optical structure 300. The touch layer 500 may include at least one touch element 510 and an insulating layer 520 covering the touch element 510. The touch element 510 may be composed of one or more metal layers, which may be a metal mesh, for example, but not limited herein. In some embodiments, the first light blocking layer 310 may be correspondingly overlapped with the touch element 510 to shield the touch element 510.

According to the structural design of the display device DI of the above embodiment, the optical structure 300 is disposed on the display layer 200, wherein the optical structure 300 includes optical filters and two light blocking layers, so that an excellent anti-reflection effect may be achieved. Furthermore, through the design of the optical structure 300, the adhesion between layers may be improved, and it is capable to be matched with the various product types of deformable display devices, such as bendable, foldable, rollable, flexible and stretchable display devices.

Figure 2:
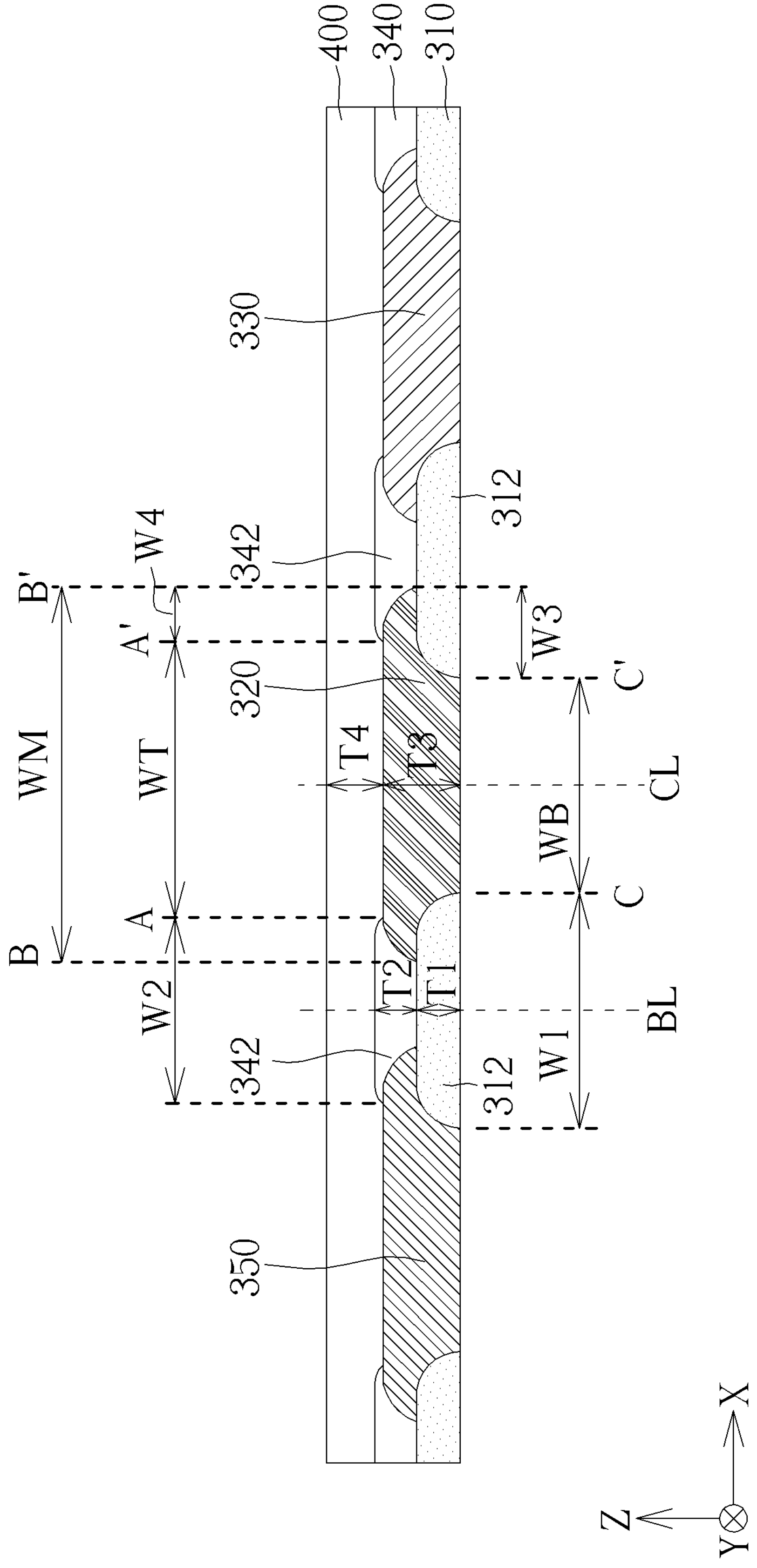
FIG. 2 is a partially-enlarged schematic diagram of an optical structure and an organic layer according to an embodiment of the present disclosure.

Please refer to FIG. 2, accompanied with FIG. 1. FIG. 2 is a partially-enlarged schematic diagram of an optical structure and an organic layer according to an embodiment of the present disclosure. As shown in FIG. 1 and FIG. 2, the first light blocking layer 310 may include a first portion 312 adjacent to the first optical filter 320. The first portion 312 may be a portion of the first light blocking layer 310 located between two adjacent optical filters in the cross-sectional view. For example, the first portion 312 may be located between the first optical filter 320 and the second optical filter 330 or between the first optical filter 320 and the third optical filter 350. An edge of the first portion 312 may have a convex curved surface, for example, but not limited herein. The second light blocking layer 340 may include a second portion 342 disposed on the first portion 312, that is, the second portion 342 may be a portion of the second light blocking layer 340 located on the first portion 312 in the cross-sectional view. An edge of the second portion 342 may have a concave curved surface, for example, but not limited herein. According to the embodiment shown in FIG. 2, the first portion 312 has a first width W1, the second portion 342 has a second width W2, and the first width W1 is greater than the second width W2, so as to improve the aperture ratio of the display layer 200 below (as shown in FIG. 1), so that the light generated by the light emitting element LE may be outputted with a wide angle when passing through the optical structure 300. The first width W1 is the maximum width of the first portion 312 in the cross-sectional view, and the second width W2 is the maximum width of the second portion 342 in the cross-sectional view. A ratio of the first width W1 to the second width W2 may be greater than or equal to 1.1 and less than or equal to 3 (i.e., $1.1 \leq W1/W2 \leq 3$). When the above ratio (W1/W2) is less than 1.1, the aperture ratio is decreased. When this ratio is greater than 3, it leads to a large difference in width between the upper layer and the lower layer and a small contact area therebetween, which may make the layers be peeled off easier. For example, the second width W2 may be 23 micrometers (μm) to 45 micrometers but not limited herein.

In the cross-sectional view of the display device DI shown in FIG. 2, the first optical filter 320 may have a top width WT, a middle width WM and a bottom width WB from the top to the bottom, wherein the middle width WM is greater than the top width WT, and the top width WT is greater than the bottom width WB (i.e., WM>WT>WB). The top width WT may be a width of the first optical filter 320 at its top or at a position with a 100% thickness of the first optical filter 320, such as the width from a point A to a point A' in FIG. 2. The middle width WM may be a width of the first optical filter 320 at a position with a 30% to 60% thickness of the first optical filter 320, such as the width from a point B to a point B' in FIG. 2 (which are the boundaries between the first optical filter 320 and the first portions 312 and the second portions 342 on two sides of the first optical filter 320 in the direction X respectively). The bottom width WB may be a width of the first optical filter 320 at its bottom or at a position with a 0% thickness of the first optical filter 320, such as the width from a point C to a point C' in FIG. 2. A central line CL extending along the direction Z may be obtained at half the bottom width WB of the first optical filter 320, wherein a distance between the point B and the central line CL is greater than a distance between the point A and the central line CL, and the distance between the point A and the central line CL is greater than a distance between the point C and the central line CL. Furthermore, according to the first optical filter 320 shown in FIG. 2, the line segment between the point A and the point B and the line segment between the point B and the point C are two arc-shaped line segments with different radians and/or bending directions, so that gaps does not easily occur when the edges of the elements are stacked, and the layers are not peeled off easily during bending, rolling or stretching.

As shown in FIG. 2, the first optical filter 320 overlaps the first light blocking layer 310 by a third width W3, and the bottom width WB of the first optical filter 320 is greater than the third width W3. The third width W3 is the maximum width of the portion where the first optical filter 320 is overlapped with the first light blocking layer 310 in the cross-sectional view. A portion of the first optical filter 320 is overlapped with the first portion 312 of the first light blocking layer 310, so that the structure of the first optical filter 320 is stable and is not peeled off easily when bending. The bottom width WB of the first optical filter 320 is the main light-outputting region of the light, so the bottom width WB is required to be designed with a larger width. A ratio of the third width W3 to the bottom width WB is greater than or equal to 0.01 and less than or equal to 0.9 (i.e., $0.01 \leq W3/WB \leq 0.9$), or may be greater than or equal to 0.03 and less than or equal to 0.5 (i.e., $0.03 \leq W3/WB \leq 0.5$). For example, the third width W3 may be 2 micrometers to 10 micrometers, such as 6 micrometers, while the bottom width WB may be 24 micrometers to 40 micrometers, such as 32 micrometers, but not limited herein.

The first optical filter 320 overlaps the first light blocking layer 310 by the third width W3, and the second light blocking layer 340 overlaps the first optical filter 320 by a fourth width W4, wherein the third width W3 is greater than the fourth width W4, so as to improve the aperture ratio of the display layer 200 below (as shown in FIG. 1), so that the light generated by the light emitting element LE may be outputted with a wide angle when passing through the optical structure 300. The fourth width W4 is the maximum width of the portion where the second light blocking layer 340 is overlapped with the first optical filter 320 in the cross-sectional view. A ratio of the third width W3 to the fourth width W4 is greater than or equal to 1.1 and less than or equal to 5 (i.e., $1.1 \leq W3/W4 \leq 5$), or may be greater than or equal to 1.5 and less than or equal to 2.1 (i.e., $1.5 \leq W3/W4 \leq 2.1$). The above ratio (W3/W4) may be 1.8, for example, but not limited herein.

As shown in FIG. 2, the first light blocking layer 310 has a first thickness T1, and the second light blocking layer 340 has a second thickness T2. A central line BL extending along the direction Z may be obtained at half the bottom width (e.g., the first width W1) of the first portion 312 of the first light blocking layer 310, wherein the first thickness T1 is the thickness of the first light blocking layer 310 obtained at the central line BL in the cross-sectional view, and the second thickness T2 is the thickness of the second light blocking layer 340 obtained at the central line BL in the cross-sectional view. For example, the first thickness T1 may be 1 micrometer to 3 micrometers, such as 1.5 micrometers, and the second thickness T2 may be 1 micrometer to 3 micrometers, such as 1.8 micrometers, but not limited herein. A ratio of the first thickness T1 to the second thickness T2 is greater than or equal to 0.5 and less than or equal to 2 (i.e., $0.5 \leq T1/T2 \leq 2$), or may be greater than or equal to 0.7 and less than or equal to 1.3 (i.e., $0.7 \leq T1/T2 \leq 1.3$). The above ratio (T1/T2) may be 1 or 0.83, for example, but not limited herein. According to the above thickness range, the structure of the elements may have better stability. When the ratio (T1/T2) is greater than 1.3, for example, when the first thickness T1 is too large, the optical filters cannot be sandwiched between the two light blocking layers. When the ratio (T1/T2) is less than 0.7, for example, when the first thickness T1 is too small, it may be difficult to effectively separate the optical filters in different regions and prone to light leakage, or when the second thickness T2 is too large, peeling off may be easily occur.

Furthermore, the first optical filter 320 has a third thickness T3, wherein the third thickness T3 is the thickness of the first optical filter 320 obtained at the central line CL in the cross-sectional view. A ratio of the first thickness T1 to the third thickness T3 is greater than or equal to 0.2 and less than or equal to 0.9 (i.e., $0.2 \leq T1/T3 \leq 0.9$), or may be greater than or equal to 0.3 and less than or equal to 0.8 (i.e., $0.3 \leq T1/T3 \leq 0.8$). The above ratio (T1/T3) may be 0.54, for example, but not limited herein. According to the above thickness range, the adjacent different optical filters may be effectively separated through the first light blocking layer 310. When the ratio (T1/T3) is greater than 0.8, for example, when the first thickness T1 is too large, the optical filters cannot be sandwiched between the two light blocking layers. When the ratio (T1/T3) is less than 0.3, for example, when the first thickness T1 is too small, it may be difficult to effectively separate the optical filters in different regions and prone to light leakage. The organic layer 400 has a fourth thickness T4, and the third thickness T3 is greater than the fourth thickness T4, wherein the third thickness T4 is the thickness of the organic layer 400 obtained at the central line CL in the cross-sectional view. A ratio of the third thickness T3 to the fourth thickness T4 is greater than or equal to 1.1 and less than or equal to 5 (i.e., $1.1 \leq T3/T4 \leq 5$), or may be greater than or equal to 1.2 and less than or equal to 3 (i.e., $1.2 \leq T3/T4 \leq 3$). The above ratio (T3/T4) may be 1.8 or 3, for example, but not limited herein. For example, the third thickness T3 may be 2 micrometers to 4 micrometers, such as 3 micrometers, and the fourth thickness T4 may be 1 micrometer to 2 micrometers, such as 1.5 micrometers, but not limited herein.

Figure 3:
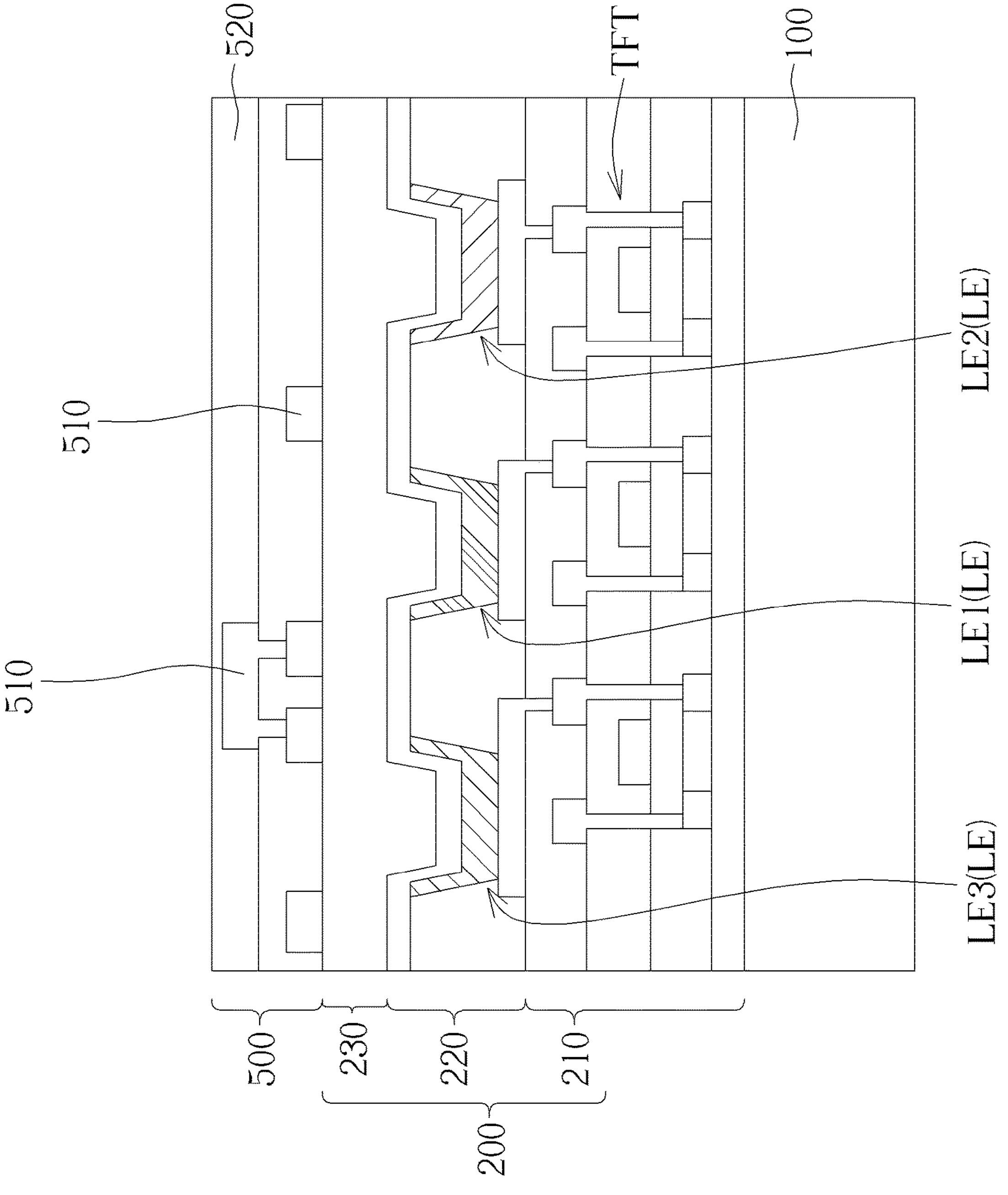
FIG. 3 to FIG. 7 are schematic diagrams of a process of a display device according to an embodiment of the present disclosure.

Please refer to FIG. 3 to FIG. 7. FIG. 3 to FIG. 7 are schematic diagrams of a process of a display device according to an embodiment of the present disclosure. The steps of manufacturing process of the display device DI of the present disclosure may be referred to the embodiment shown in FIG. 3 to FIG. 7, and the detailed structure and material of some of the elements may be referred to the description of the embodiment shown in FIG. 1, which will are not be repeated herein. As shown in FIG. 3, the substrate 100 may be provided first, then the circuit layer 200 including a plurality of thin film transistors TFT is formed on the substrate 100, and then the light emitting layer 220 including a plurality of light emitting elements LE is formed on the circuit layer 210. The circuit layer 200 and the light emitting layer 220 may form the display layer 200. For example, the light emitting elements LE (such as organic light-emitting diodes shown in FIG. 3) may be directly formed on the circuit layer 210, or the light emitting elements LE (such as micro light-emitting diodes shown in FIG. 9) may be disposed on the circuit layer 210 through indirect transfer, but not limited herein. The light emitting element LE1 may emit green light, the light emitting element LE2 may emit blue light, and the light emitting element LE3 may emit red light, but not limited herein. Then, the touch layer 500 may be formed on the display layer 200, and the touch layer 500 may include the touch elements 510 and the insulating layer 520 covering the touch elements 510.

Figure 4:
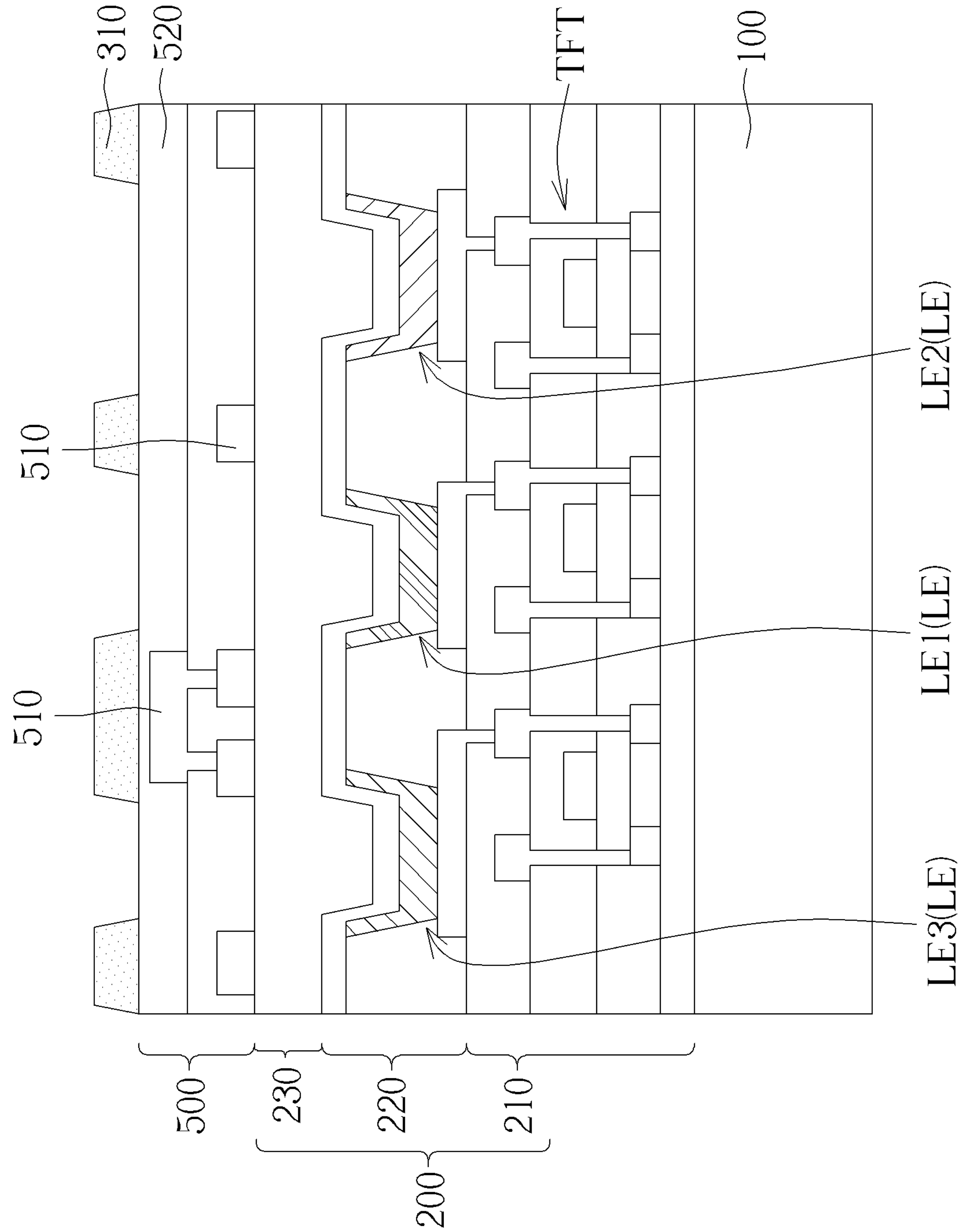
Figure 5:
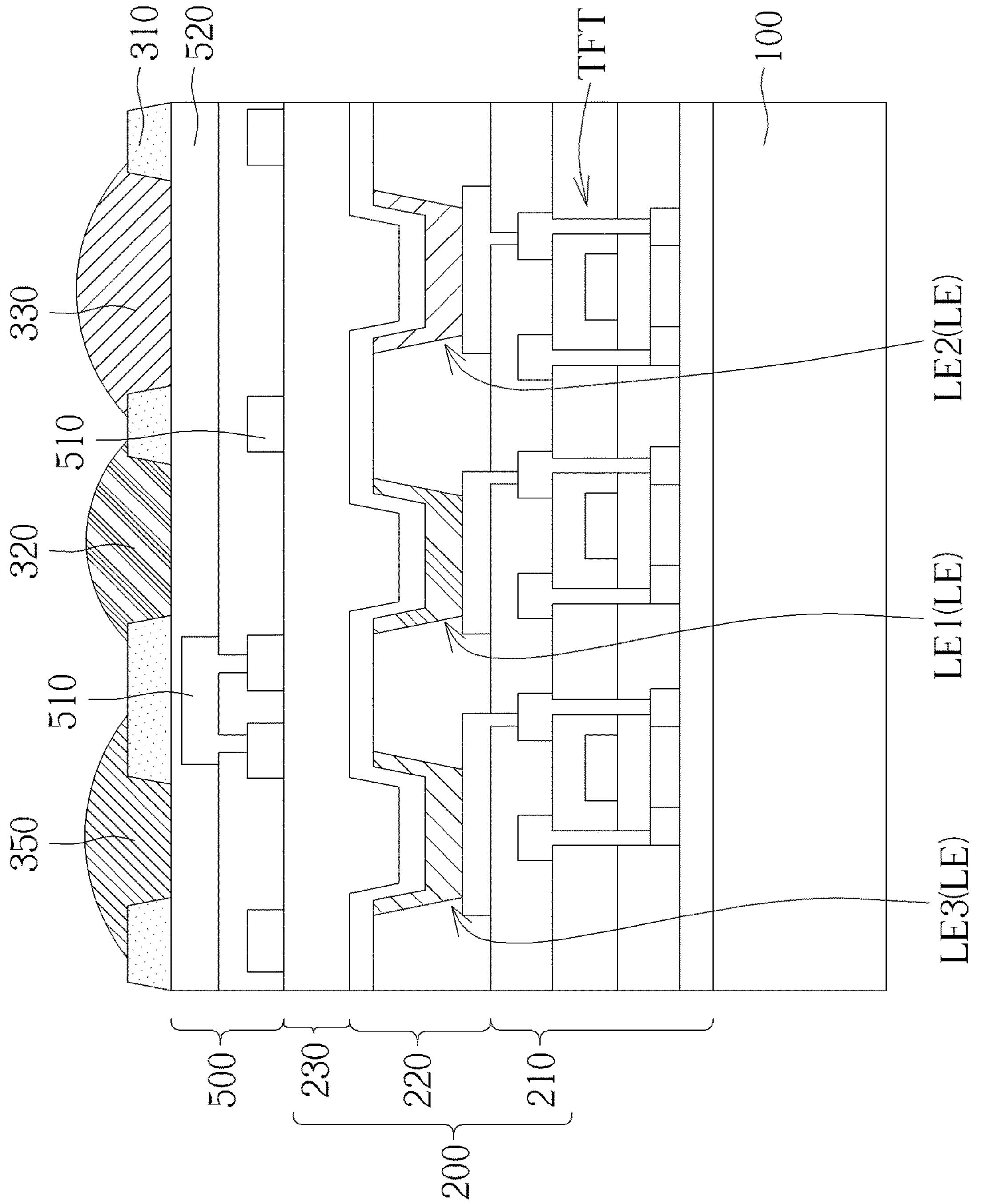

Then after FIG. 3, as shown in FIG. 4, the first light blocking layer 310 may be directly formed on the insulating layer 520, and the first light blocking layer 310 may be overlapped with the touch elements 510. Then, as shown in FIG. 5, the first optical filter 320, the second optical filter 330 and the third optical filter 350 are formed on the first light blocking layer 310, and the first optical filter 320, the second optical filter 330 and the third optical filter 350 are separated from each other and not in contact with each other. For example, the first optical filter 320, the second optical filter 330 and the third optical filter 350 may be formed through a photolithography process, a coating process or an inkjet printing process, which may be formed in sequence or at one time. According to the embodiment shown in FIG. 5, the first optical filter 320 may be a green optical filter, the second optical filter 330 may be a blue optical filter, and the third optical filter 350 may be a red optical filter. The relationship of the sizes (e.g., the areas in a top view) of the above three optical filters may be that the second optical filter 330 is greater than the first optical filter 320 and the third optical filter 350, and the first optical filter 320 may be similar to the third optical filter 350. In an embodiment, the third optical filter 350 is greater than the first optical filter 320, but the present disclosure is not limited herein. In the embodiment shown in FIG. 1, the sizes of the three optical filters may be the same.

Figure 6:
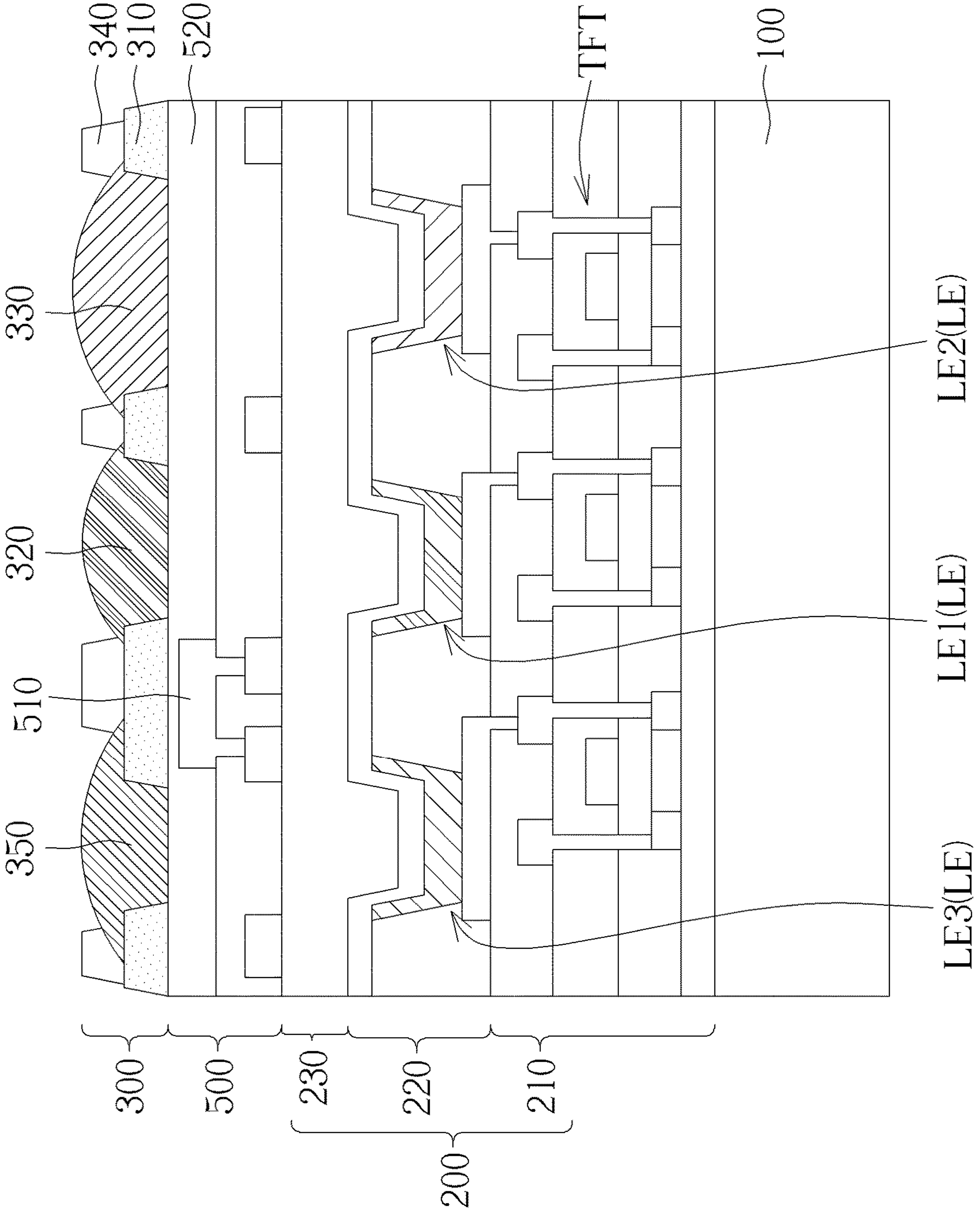
Figure 7:
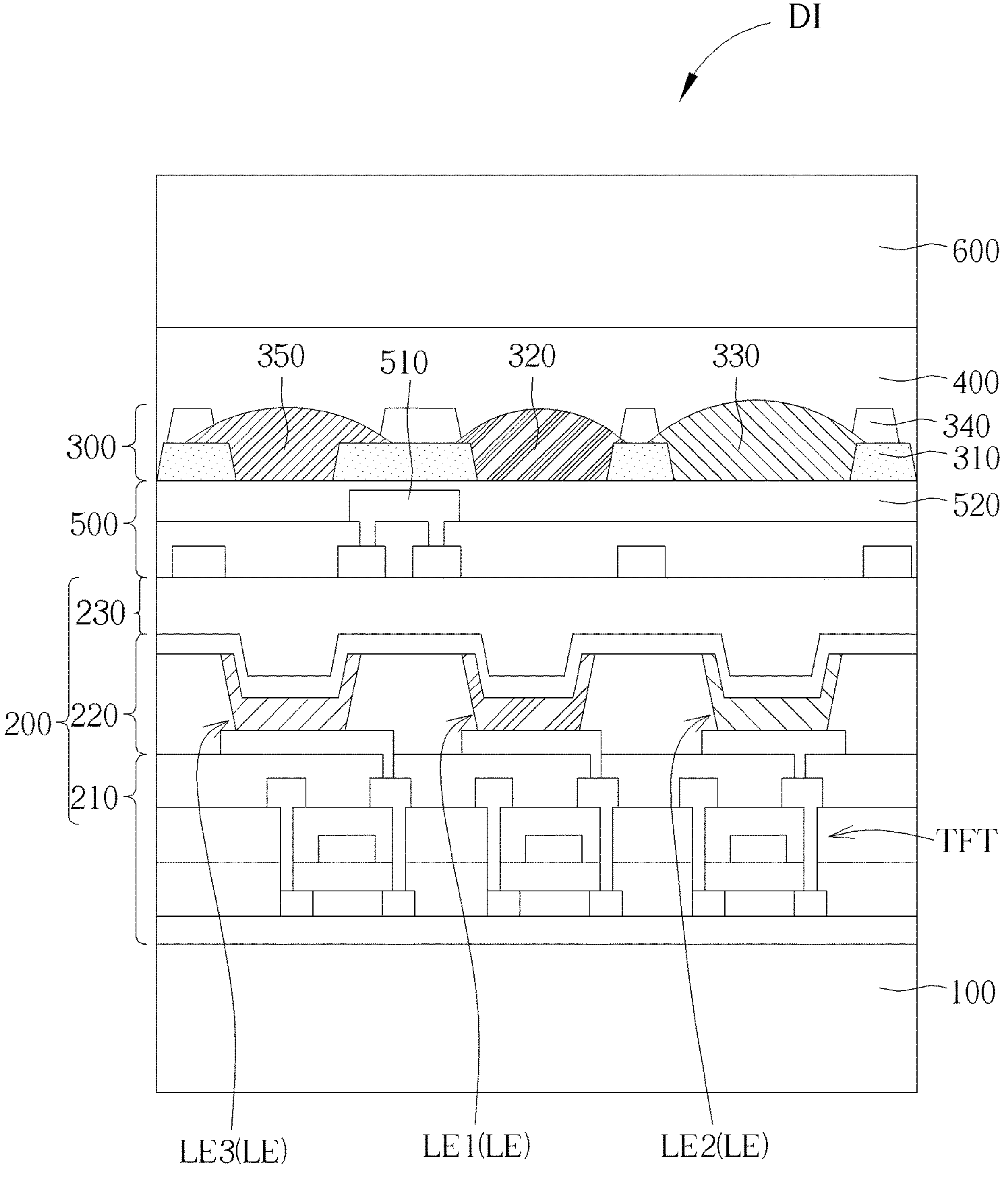
Figure 8:
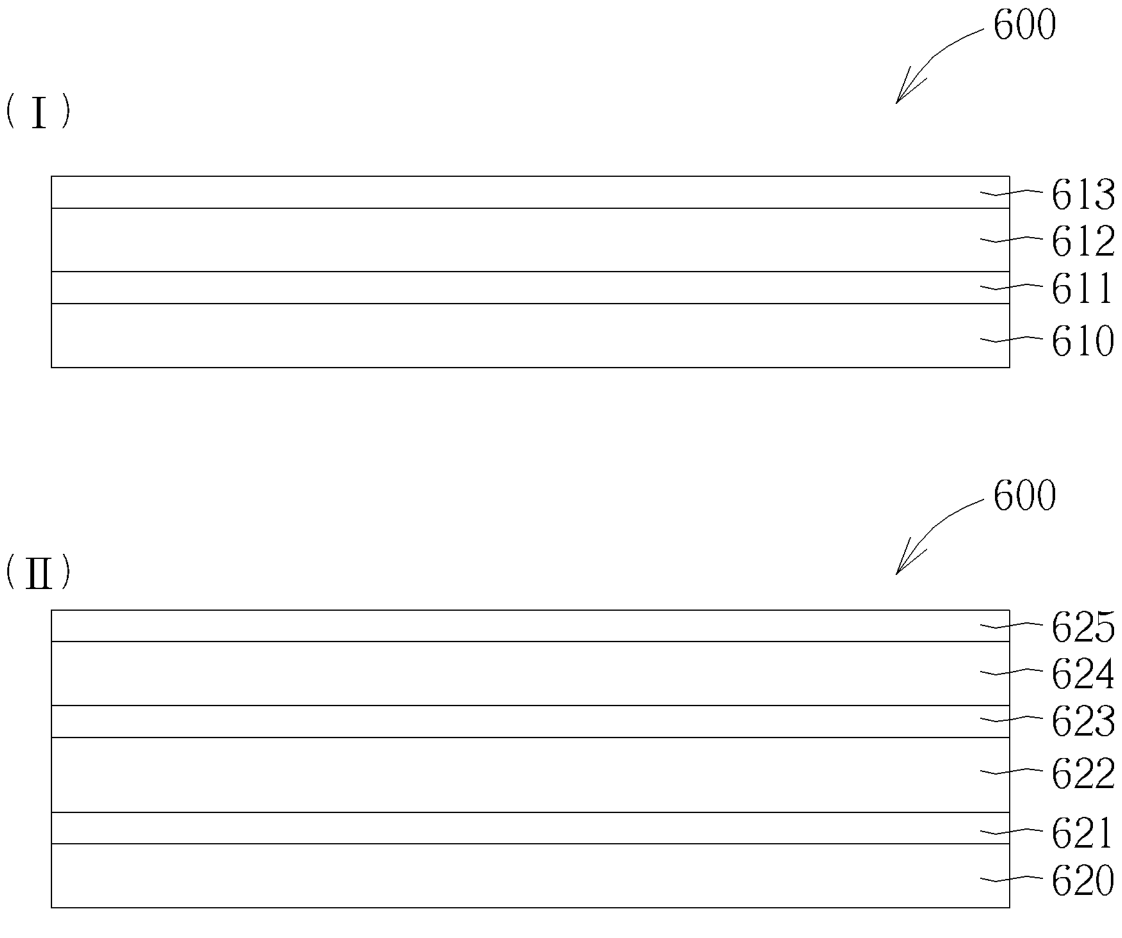
FIG. 8 is a cross-sectional schematic diagram of some embodiments of a cover layer according to a display device of the present disclosure.

After FIG. 5, the second light blocking layer 340 is formed on the first optical filter 320, the second optical filter 330, the third optical filter 350 and the first light blocking layer 310, wherein the first optical filter 320, the second optical filter 330 and the third optical filter 350 respectively have a portion disposed between the second light blocking layer 340 and the first light blocking layer 310, as shown in FIG. 6. Then, as shown in FIG. 7, the organic layer 400 may be formed on the second light blocking layer 340, so that the organic layer 400 may be used as a planar layer to cover the elements therebelow, and then a cover layer 600 may be attached or directly formed on the organic layer 400. The structure of the cover layer 600 may be referred to an example (I) and an example (II) of FIG. 8. FIG. 8 is a cross-sectional schematic diagram of some embodiments of a cover layer according to a display device of the present disclosure. As shown in the example (I) of FIG. 8, the cover layer 600 may include an organic layer 610, an adhesive layer 611, an organic layer 612 and a hard coating 613 stacked in sequence, wherein, for example, the organic layer 610 may include colorless polyimide (CPI), the adhesive layer 611 may include acrylate material, the organic layer 612 may include polyethylene terephthalate, and the hard coating 613 may include poly(methyl methacrylate), but not limited herein. As shown in the example (II) of FIG. 8, the cover layer 600 may include an organic layer 620, an adhesive layer 621, an ultra-thin glass (UTG) 622, an adhesive layer 623, an organic layer 624 and a hard coating 625 stacked in sequence, wherein, for example, the organic layer 620 and the organic layer 624 may include polyethylene terephthalate, the adhesive layer 621 and the adhesive layer 623 may include acrylate material, and the hard coating 625 may include poly(methyl methacrylate), but not limited herein.

Figure 9:
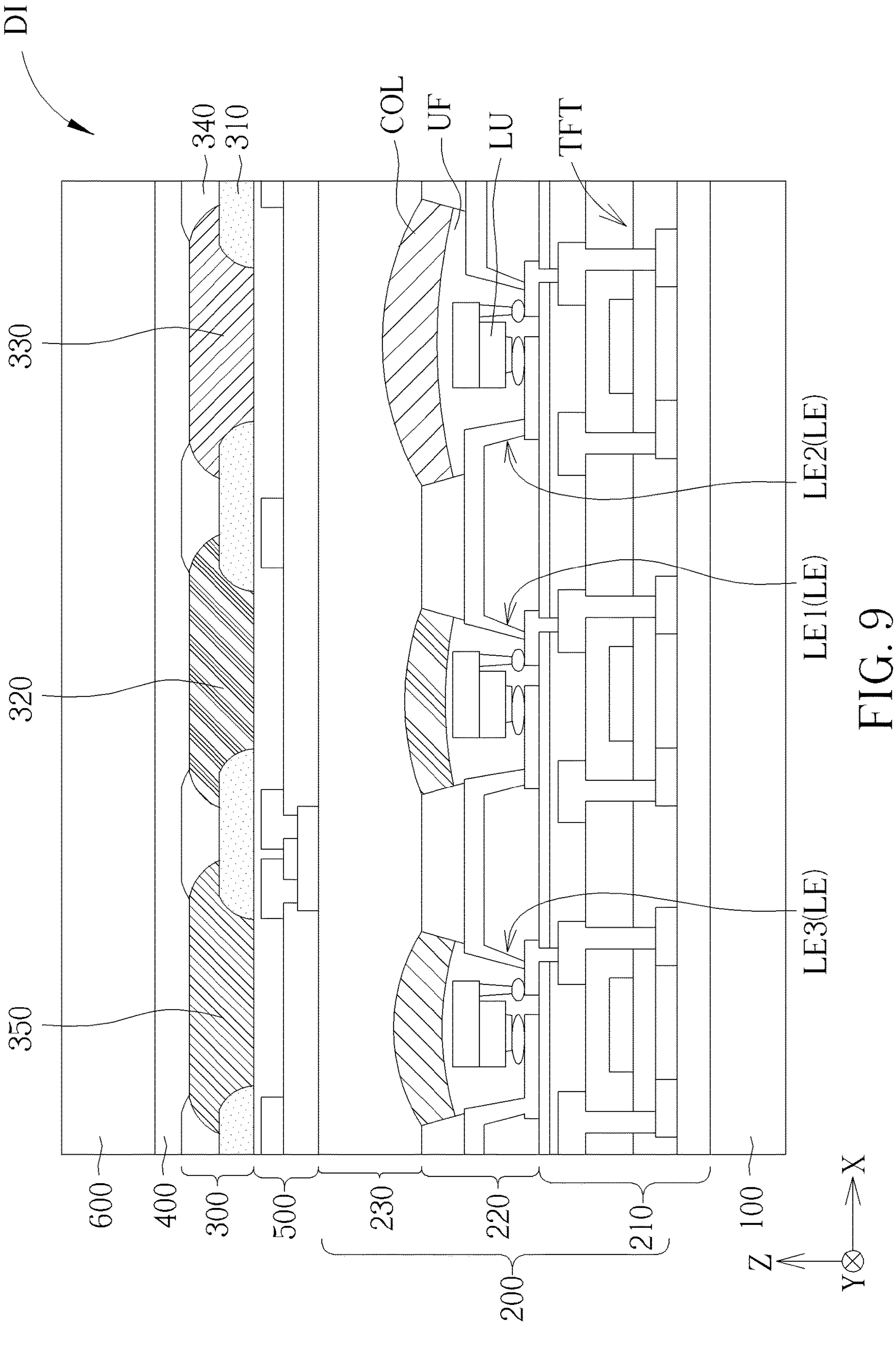
FIG. 9 is a cross-sectional schematic diagram of a display device according to a second embodiment of the present disclosure.

Please refer to FIG. 9, which is a cross-sectional schematic diagram of a display device according to a second embodiment of the present disclosure. As shown in FIG. 9, the difference between the display device DI of the second embodiment and the previous embodiment is that each of the light emitting elements LE in the light emitting layer 220 may include a light emitting unit LU, a filling layer UF and a color conversion layer COL, wherein the color conversion layer COL may include, for example (but not limited to), quantum dot material. The color conversion layer COL of the light emitting element LE1 may be a green conversion layer, the color conversion layer COL of the light emitting element LE2 may be a blue conversion layer or may be replaced by a diffusion layer filled with diffusion particles (such as titanium dioxide), and the color conversion layer COL of the light emitting element LE3 may be a red conversion layer, but not limited herein. In the second embodiment, the light emitting unit LU of each of the light emitting elements LE may emit blue light. In other embodiments, the light emitting unit LU of the light emitting element LE1 may emit green light, the light emitting unit LU of the light emitting element LE2 may emit blue light, and the light emitting unit LU of the light emitting unit LE3 may emit blue light, wherein the color conversion layer COL of the above light emitting element LE1 may be replaced by a diffusion layer filled with diffusion particles (such as titanium dioxide).

Figure 10:
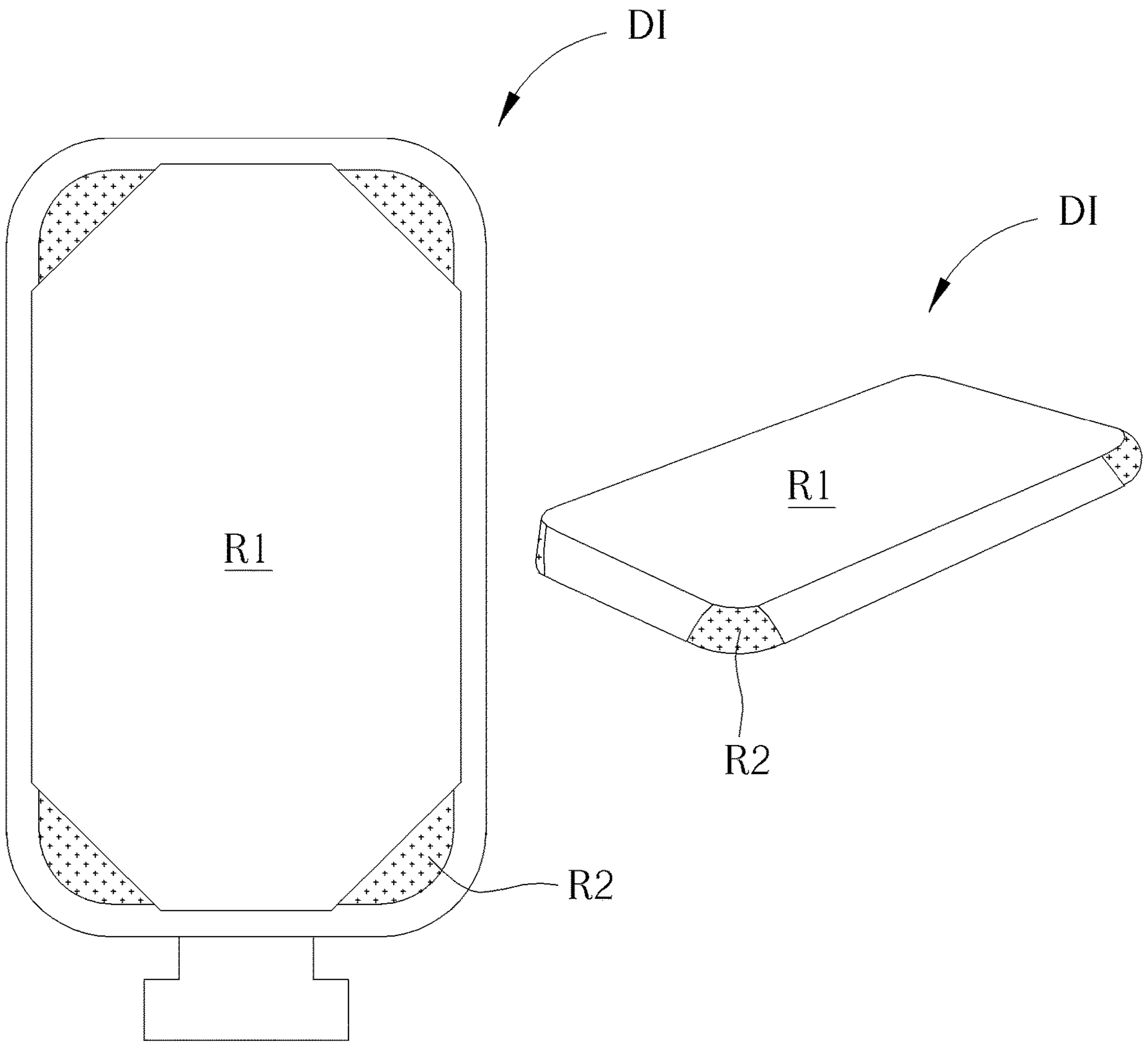
FIG. 10 is a top-view schematic diagram and a side-view schematic diagram of a display device according to an embodiment of the present disclosure.
Figure 11:
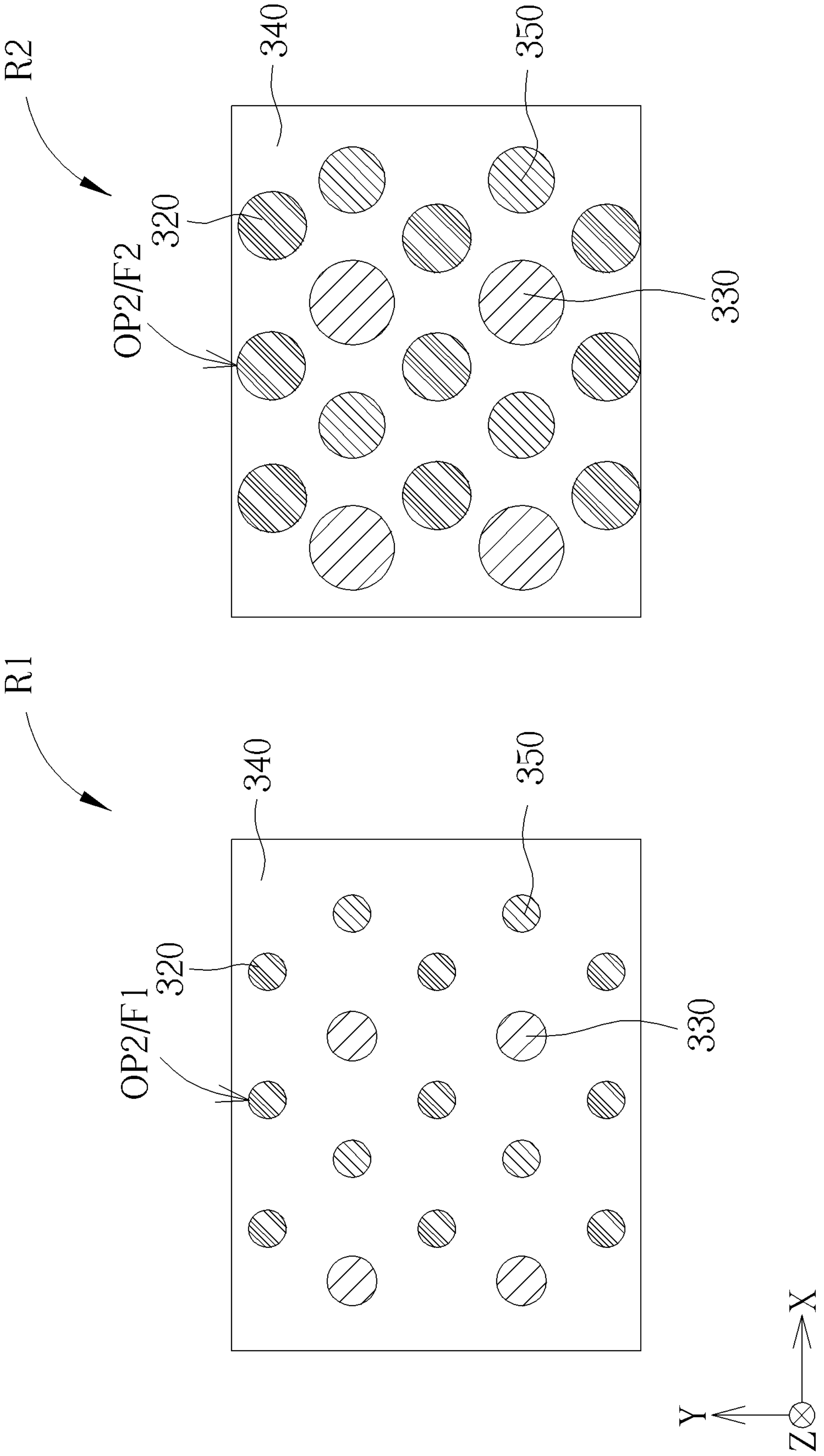
FIG. 11 is a top-view schematic diagram of optical filters in different regions according to an embodiment of the display device shown in FIG. 10.

Please refer to FIG. 10 and FIG. 11. FIG. 10 is a top-view schematic diagram and a side-view schematic diagram of a display device according to an embodiment of the present disclosure, wherein the partially cross-sectional structure thereof may be correspondingly referred to the cross-sectional view shown in FIG. 1, FIG. 7 or FIG. 9. FIG. 11 is a top-view schematic diagram of optical filters in different regions according to an embodiment of the display device shown in FIG. 10. The substrate 100 of the display device DI of the present disclosure may include flexible material or stretchable material, so that the substrate 100 may have a three-dimensional curved surface as shown in the top view at the left side and the side view at the right side of FIG. 10 through shaping. Specifically, the substrate 100 may include a first region R1 having a first Gaussian curvature K1 and a second region R2 having a second Gaussian curvature K2, and an absolute value of the first Gaussian curvature K1 is less an absolute value of the second Gaussian curvature K2, that is, the bending curvature of the second region R2 may be, for example, greater than the bending curvature of the first region R1. Furthermore, the optical structure 300 is disposed on the first region R1 and the second region R2. A triangle can be formed by connecting any three points obtained on the curved surface. The Gaussian curvature of the curved surface is 0 when the sum of the internal angles of the triangle is 180 degrees, and a straight line can be obtained in at least one direction on the curved surface. The Gaussian curvature of the curved surface is greater than 0 when the sum of the internal angles of the triangle is greater than 180 degrees, and the curved surface is a convex surface. The Gaussian curvature of the curved surface is less than 0 when the sum of the internal angles of the triangle is less than 180 degrees, and the curved surface is a concave surface. Therefore, the absolute value of the Gaussian curvature of a plane surface is equal to 0, and the absolute value of the Gaussian curvature of a curved surface which is concave or convex is not equal to 0. For example, the second region R2 may be one of the corner regions of the display device DI, and the second Gaussian curvature K2 of the second region R2 may be greater than 0. The first region R1 may be a non-corner region of the display device DI, and the first Gaussian curvature K1 of the first region R1 may be equal to 0, representing a flat plane, but the first region R1 is not limited to a plane, which may also be a three-dimensional curved surface.

As shown in FIG. 10 and FIG. 11, in the first region R1 and the second region R2, the second openings OP2 of the second light blocking layer 340 may correspond to the first optical filter 320, the second optical filter 330 and the third optical filter 350 respectively. As shown in the top view at the left side of FIG. 11, one of the second openings OP2 may be overlapped with the first region R1 and has a first area, and as shown in the top view at the right side of FIG. 11, another one of the second openings OP2 may be overlapped with the second region R2 and has a second area, wherein the second area is greater than the first area. The first area and the second area may be the area occupied by the second opening OP2 in the top views respectively, which may be substantially the same as the area of one of the filter regions corresponding to the first optical filter 320, the second optical filter 330 and the third optical filter 350. That is to say, according to display device DI of this embodiment, the display layer 200 disposed on the substrate 100 may include a plurality of first light emitting elements on the first region R1 and a plurality of second light emitting elements on the second region R2, wherein types of the first light emitting elements and the second light emitting elements may be the light emitting element LE shown in FIG. 1, FIG. 7 or FIG. 9. Furthermore, the optical structure 300 disposed on the display layer 200 may include a plurality of first optical filter regions F1 overlapped with the first light emitting elements respectively and a plurality of second optical filter regions F2 overlapped with the second light emitting elements respectively. The first optical filter regions F1 may be the opening regions of the optical structure 300 in the top view, that is, each of the first optical filter regions F1 may correspond to one of the second openings OP2, which is overlapped with the first light emitting element located in the first region R1. The second optical filter regions F2 may be the opening regions of the optical structure 300 in the top view, that is, each of the second optical filter regions F2 may correspond to one of the second openings OP2, which is overlapped with the second light emitting element located in the second region R2. As shown in FIG. 11, one of the first optical filter regions F1 has a first area, one of the second optical filter regions F2 has a second area, and the second area is greater than the first area. Since the bending curvature of the second region R2 is greater than the bending curvature of the first region R1 in the display device DI, the area of the second opening OP2 and/or the second optical filter region F2 in the second region R2 can be larger accordingly, which may improve the anti-reflection effect.

In some embodiments, in the first region R1 or the second region R2, the second openings OP2 corresponding to the first optical filter 320, the second optical filter 330 and the third optical filter 350 may have the same or different areas respectively. As an example, the second openings OP2 corresponding to the optical filters have different areas respectively in FIG. 11 and FIG. 12, but the present disclosure is not limited herein. For example, the area of the second opening OP2 corresponding to the second optical filter 330 may be greater than the area of the second opening OP2 corresponding to the first optical filter 320 and the area of the second opening OP2 corresponding to the third optical filter 350, and the area of the second opening OP2 corresponding to the first optical filter 320 may be similar to the area of the second opening OP2 corresponding to the third optical filter 350, but not limited herein.

Figure 12:
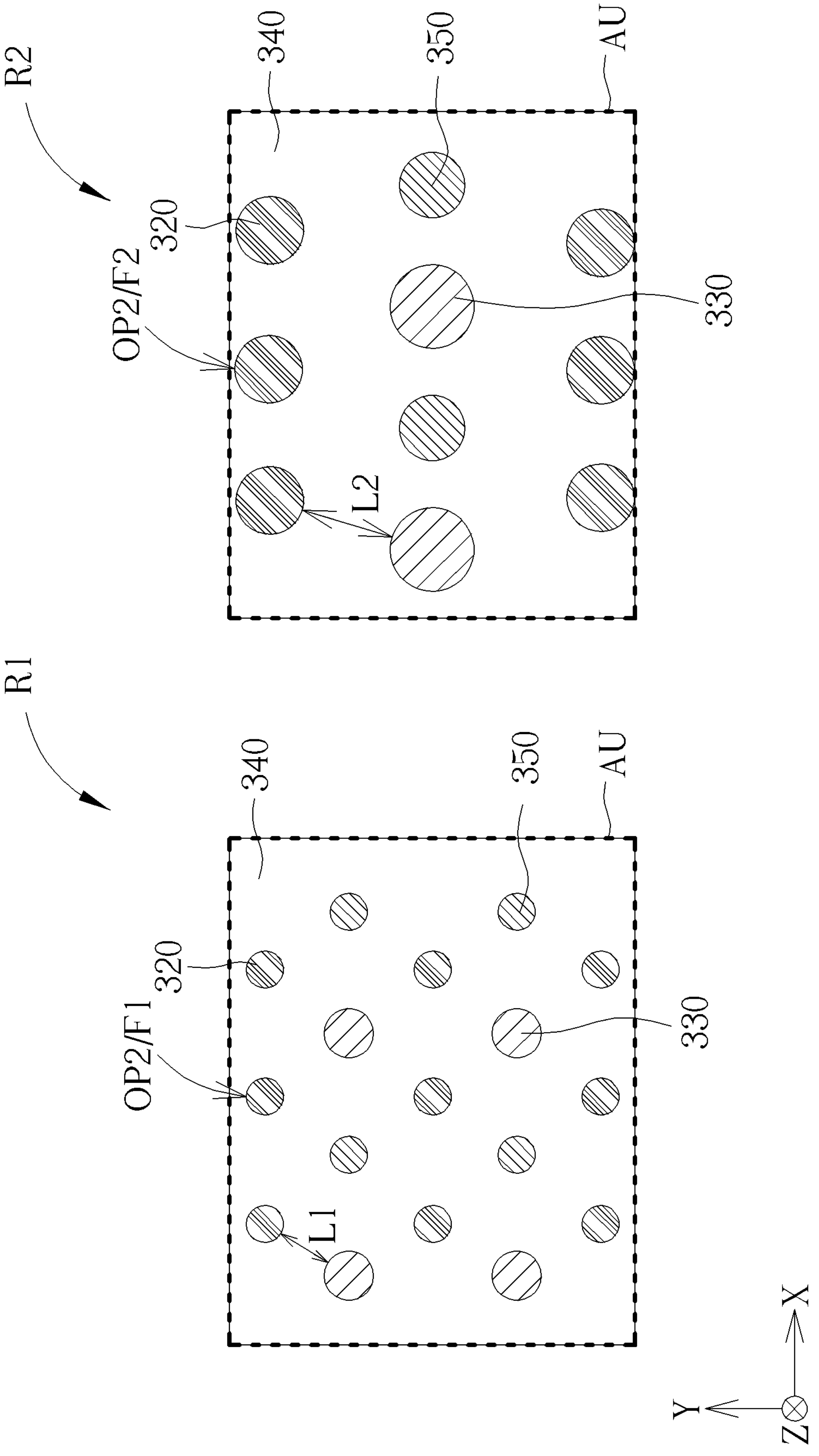
FIG. 12 is a top-view schematic diagram of optical filters in different regions according to another embodiment of the display device shown in FIG. 10.

Please refer to FIG. 12, accompanied with FIG. 10. FIG. 12 is a top-view schematic diagram of optical filters in different regions according to another embodiment of the display device shown in FIG. 10. As shown in the top view at the left side of FIG. 12, two adjacent ones of the second openings OP2 may be overlapped with the first region R1 and spaced apart from each other by a first distance L1, and as shown in the top view at the right side of FIG. 12, another two adjacent ones of the second openings OP2 may be overlapped with the second region R2 and spaced apart from each other by a second distance L2, wherein the second distance L2 is different from the first distance L1. For example, the second distance L2 may be greater than or less than the first distance L1. The first distance L1 may be the shortest distance between two adjacent second openings OP2 of the second openings OP2 in the first region R1, and the second distance L2 may be the shortest distance between two adjacent second openings OP2 of the second openings OP2 in the second region R2. That is to say, according to the display device DI of the embodiment shown in FIG. 12, two adjacent ones of the first optical filter regions F1 are spaced apart from each other by the first distance L1, two adjacent ones of the second optical filter regions F2 are spaced apart from each other by the second distance L2, and the second distance L2 is different from the first distance L1. For example, the second distance L2 may be greater than or less than the first distance L1. The first distance L1 may be the shortest distance between two adjacent first optical filter regions F1 in the first region R1, and the second distance L2 may be the shortest distance between two adjacent second optical filter regions F2 in the second region R2. Since the bending curvature of the second region R2 is greater than the bending curvature of the first region R1 in the display device DI, the distance between two adjacent second openings OP2 and/or two adjacent second optical filter regions F2 in the second region R2 can be larger (i.e., increasing the distance between pixels), which may improve the resolution and the anti-reflection effect.

Furthermore, as shown in the top view at the left side of FIG. 12, a first number of the second openings OP2 are in one unit area AU of the first region R1, and as shown in the top view at the right side of FIG. 12, a second number of the second openings OP2 are in one unit area AU of the second region R2, wherein the second number is less than the first number. The first number may be the number of second openings OP2 per unit area AU among the second opening OP2 in the first region R1, and the second number may be the number of second openings OP2 per unit area AU (which is the same as the above unit area AU) among the second opening OP2 in the second region R2. The second number less than the first number means that the density of the second openings OP2 in the second region R2 is less than the density of the second openings OP2 in the first region R1, that is, the density of the second openings OP2 in the second region R2 with larger bending curvature is lower. That is to say, according to the display device DI of the embodiment shown in FIG. 12, a first number of the first optical filter regions F1 are in a unit area AU of the optical structure 300, and a second number of the second optical filter regions F2 are in another unit area AU of the optical structure 300, wherein the second number is less than the first number. The first number may be the number of first optical filter regions F1 per unit area AU in the first region R1, and the second number may be the number of second optical filter regions F2 per unit area AU (which is the same as the above unit area AU) in the second region R2. The second number less than the first number means that the density of the second optical filter regions F2 in the second region R2 is less than the density of the first optical filter regions F1 in the first region R1, that is, the density of the optical filter regions in the second region R2 with larger bending curvature is lower.

From the above description, according to the display devices of the embodiments of the present disclosure, by disposing the optical structure on the display layer, wherein the optical structure includes optical filters and two light blocking layers and, an excellent anti-reflection effect may be achieved. Furthermore, through the design of the optical structure, the adhesion between layers may be improved, and the structure may be matched with various product types of deformable display devices. In addition, for the region with a larger absolute value of Gaussian curvature, the area, distance and/or density of the openings or optical filter regions can be variable, thereby improving the anti-reflection effect.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:

a substrate;

a display layer disposed on the substrate, the display layer comprising a plurality of light emitting elements; and an optical structure disposed on the display layer, the optical structure comprising:

a first light blocking layer having a plurality of first openings overlapped with the light emitting elements respectively;

a first optical filter disposed in at least one of the first openings;

a second optical filter disposed in at least another one of the first openings and adjacent to the first optical filter; and a second light blocking layer disposed on the first light blocking layer and having a plurality of second openings overlapped with the first openings respectively, wherein in a cross-sectional view of the display device, the first optical filter is separated from the second optical filter, and at least a portion of the second light blocking layer is disposed between the first optical filter and the second optical filter, wherein the substrate comprises a first region having a first Gaussian curvature and a second region having a second Gaussian curvature, an absolute value of the first Gaussian curvature is less an absolute value of the second Gaussian curvature, and the optical structure is disposed on the first region and the second region.

2. The display device according to claim 1, wherein the first light blocking layer is in contact with the second light blocking layer.

3. The display device according to claim 1, wherein the first light blocking layer has a first thickness, the second light blocking layer has a second thickness, and a ratio of the first thickness to the second thickness is greater than or equal to 0.5 and less than or equal to 2.

4. The display device according to claim 1, wherein one of the second openings is overlapped with the first region and has a first area, another one of the second openings is overlapped with the second region and has a second area, and the second area is greater than the first area.

5. The display device according to claim 1, wherein two adjacent ones of the second openings are overlapped with the first region and spaced apart from each other by a first distance, another two adjacent ones of the second openings are overlapped with the second region and spaced apart from each other by a second distance, and the second distance is different from the first distance.

6. The display device according to claim 1, wherein a first number of the second openings are in one unit area of the first region, a second number of the second openings are in one unit area of the second region, and the second number is less than the first number.

7. The display device according to claim 1, further comprising an organic layer disposed on the second light blocking layer and the first optical filter, wherein the first optical filter has a third thickness, the organic layer has a fourth thickness, and the third thickness is greater than the fourth thickness.

8. The display device according to claim 7, wherein a ratio of the third thickness to the fourth thickness is greater than or equal to 1.1 and less than or equal to 5.

9. The display device according to claim 1, wherein a portion of the first optical filter is disposed between the first light blocking layer and the second light blocking layer.

10. The display device according to claim 9, wherein the first light blocking layer comprises a first portion adjacent to the first optical filter, and the second light blocking layer comprises a second portion disposed on the first portion, wherein the first portion has a first width, the second portion has a second width, and the first width is greater than the second width.

11. The display device according to claim 10, wherein a ratio of the first width to the second width is greater than or equal to 1.1 and less than or equal to 3.

12. The display device according to claim 9, wherein the first optical filter overlaps the first light blocking layer by a third width, the first optical filter has a bottom width, and the bottom width is greater than the third width.

13. The display device according to claim 12, wherein a ratio of the third width to the bottom width is greater than or equal to 0.01 and less than or equal to 0.9.

14. The display device according to claim 9, wherein the first optical filter overlaps the first light blocking layer by a third width, the second light blocking layer overlaps the first optical filter by a fourth width, and the third width is greater than the fourth width.

15. The display device according to claim 14, wherein a ratio of the third width to the fourth width is greater than or equal to 1.1 and less than or equal to 5.

16. The display device according to claim 15, wherein the ratio is greater than or equal to 1.5 and less than or equal to 2.1.

17. A display device, comprising:

a substrate having a first region with a first Gaussian curvature and a second region with a second Gaussian curvature, an absolute value of the first Gaussian curvature being less than an absolute value of the second Gaussian curvature;

a display layer disposed on the substrate, the display layer comprising a plurality of first light emitting elements on the first region and a plurality of second light emitting elements on the second region; and an optical structure disposed on the display layer, the optical structure comprising a plurality of first optical filter regions overlapped with the first light emitting elements respectively and a plurality of second optical filter regions overlapped with the second light emitting elements respectively, wherein one of the first optical filter regions has a first area, one of the second optical filter regions has a second area, and the second area is greater than the first area.

18. The display device according to claim 17, wherein two adjacent ones of the first optical filter regions are spaced apart from each other by a first distance, two adjacent ones of the second optical filter regions are spaced apart from each other by a second distance, and the second distance is different from the first distance.

19. The display device according to claim 17, wherein a first number of the first optical filter regions are in a unit area of the optical structure, a second number of the second optical filter regions are in another unit area of the optical structure, and the second number is less than the first number.

* * * * *